(12) United States Patent  (10) Patent No.: US 7,700,431 B2
Okonogi et al.  (45) Date of Patent: Apr. 20, 2010

(54) METHOD FOR MANUFACTURING A SEMICONDUCTOR DEVICE HAVING POLYSILICON PLUGS

(75) Inventors: Kensuke Okonogi, Tokyo (JP); Kiyonori Ohyu, Tokyo (JP); Kazutaka Manabe, Tokyo (JP); Satoru Yamada, Tokyo (JP); Takuo Ohashi, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 690 days.

(21) Appl. No.: 11/153,321

(22) Filed: Jun. 16, 2005

(65) Prior Publication Data

US 2005/0282335 A1 Dec. 22, 2005

(30) Foreign Application Priority Data

Jun. 17, 2004 (JP) .............................. 2004-179358

(51) Int. Cl.
*H01L 21/8242* (2006.01)
*H01L 21/44* (2006.01)

(52) U.S. Cl. ............... 438/239; 438/675; 257/E21.165; 257/E21.166

(58) Field of Classification Search ................. 438/239, 438/785, 675, 677
See application file for complete search history.

(56) References Cited

U.S. PATENT DOCUMENTS 5,998,820 A * 12/1999 Chi .......................... 257/296

| | | | | |
|---|---|---|---|---|
| 6,482,684 B1 * | 11/2002 | Yamazaki | .................... | 438/158 |
| 6,930,039 B2 * | 8/2005 | Schuele et al. | .............. | 438/643 |
| 2002/0004299 A1 * | 1/2002 | Schuele et al. | .............. | 438/653 |
| 2002/0155662 A1 * | 10/2002 | Asano et al. | ................. | 438/253 |
| 2003/0057467 A1 * | 3/2003 | Juengling | ................... | 257/296 |

FOREIGN PATENT DOCUMENTS

| JP | 6-310458 | 11/1994 |
|---|---|---|
| JP | 11-68062 | 3/1999 |
| JP | 2003-31684 | 1/2003 |
| JP | 2003-224203 | 8/2003 |
| KR | 2000-0044904 | 7/2000 |

OTHER PUBLICATIONS

Japanese Office Action dated May 21, 2007, with partial English translation.
Korean Office Action dated Aug. 21, 2006, with partial English translation.

* cited by examiner

*Primary Examiner*—Alexander G Ghyka
(74) *Attorney, Agent, or Firm*—McGinn Intellectual Property Law Group, PLLC

(57) ABSTRACT

A method for manufacturing a DRAM device on a silicon substrate includes: forming cell transistors in a memory cell area and other transistors in a peripheral circuit area; forming polysilicon plugs connected to diffused regions of the cell transistors and metallic plugs connected to diffused regions of the other transistors; heat treating at a temperature of 980 to 1,020 degrees C.; heat treating at a temperature of 700 to 850 degrees C.; implanting fluorine or boron fluoride into the diffused regions of the other transistors; and heat treating at a temperature of 500 to 850 degrees C.

20 Claims, 7 Drawing Sheets

Junction leakage current of TEG (A)

METHOD FOR MANUFACTURING A SEMICONDUCTOR DEVICE HAVING POLYSILICON PLUGS

BACKGROUND OF THE INVENTION (a) Field of the Invention

The present invention relates to a method for manufacturing a semiconductor device having polysilicon plugs and, more particularly, to a heat treatment technique after forming polysilicon plugs in a semiconductor device.

(b) Description of the Related Art

A DRAM (dynamic random access memory) device includes therein a memory cell area for storing data and a peripheral circuit area for controlling write/read of data into/from the memory cell area. Each DRAM memory cell in the memory cell area includes a capacitor for storing therein electric charge and a cell transistor acting as a switch for supplying the electric charge to the capacitor. A cell transistor may include a polysilicon electrode, or polysilicon plug, in contact with a diffused region of the cell transistor.

FIGS. 2A to 2F consecutively show a conventional fabrication process for manufacturing a DRAM device. First, as shown in FIG. 2A, an isolation region 12, known as a shallow isolation trench, is formed on a surface region of a silicon substrate 11 by using a known technique, for isolating a memory cell area 10A from a peripheral circuit area 10B.

Subsequently, an ion-implantation step is conducted for forming an n-type shield layer 13 in a deep region of the silicon substrate 11. Then, a p-type well layer (p-well) 14 is formed on the n-type shield layer 13 in the memory-cell transistor area 10A, whereas an n-type well layer (n-well) 15 is formed on the n-type shield layer 13 in the peripheral circuit area 10B. Thereafter, a p-type channel layer and an n-type channel layer are formed on the p-well 14 and n-well 15, respectively, although these channel layers are not specifically shown in FIG. 2A.

Subsequently, a gate oxide film 16 is formed on the entire area of the silicon substrate 11 by using a thermal oxidation technique, followed by depositing a gate electrode layer on the gate oxide film 16 by sputtering. A patterned insulation film 18 is then used for patterning the deposited gate electrode layer to thereby form gate electrodes 17, to obtain the structure shown in FIG. 2A.

Thereafter, phosphorous is implanted into the memory cell area 10A by ion-implantation using the patterned insulation film 18 as a mask to form lightly-doped diffused regions 19, whereas boron is implanted into the peripheral circuit area 10B by ion-implantation using the patterned insulation film 18 as a mask to form lightly-doped diffused regions 20. A heat treatment is then performed to activate the implanted phosphorous in the n-type lightly-doped diffused regions 19 and the implanted boron in the p-type lightly-doped diffused regions 20, to thereby obtain the structure shown in FIG. 2B.

Subsequently, side spacers 21 are formed on the side walls of the gate electrodes 17 and the overlying patterned insulation film 18 by using a known technique. Boron is again implanted into the peripheral circuit area 10B by using the patterned insulation film 18 and the side spacers 21 as a mask, followed by a heat treatment to activate the implanted boron to form p-type heavily-doped diffused regions 22 in the peripheral circuit area 10B, as shown in FIG. 2C.

Thereafter, a first interlevel dielectric film 23 is deposited on the entire surface, followed by forming through-holes 26 in the first interlevel dielectric film 23 within the memory cell area 10A to reach the n-type diffused regions 19. Phosphorous is then implanted into the regions underlying the n-type diffused regions 19 by using the first interlevel dielectric film 23 and the side spacers 21 as a mask in the memory cell area 10A. This phosphorous implantation is performed to form electric-field alleviation regions underlying the n-type diffused regions 19. Polysilicon contact plugs 24 are then formed to fill the through-holes 26, as shown in FIG. 2D.

A second interlevel dielectric film 25 is then deposited on the entire area, as shown in FIG. 2E, followed by a high-temperature heat treatment in a $N_2$ environment at a temperature of 1,000 degrees C. for 10 seconds. This high-temperature heat treatment reduces the resistances of the polysilicon plugs 24 as well as the contact resistances between the contact plugs 24 and the n-type diffused regions 19.

Through-holes 27 are then formed in the second interlevel dielectric film 25 within the memory cell area 10A to reach the polysilicon plugs 24. Through-holes 28 are then formed in the first and second interlevel dielectric films 23 and 25 within the peripheral circuit area 10B to reach the p-type heavily-doped diffused regions 22. Thereafter, thin titanium film, thin titanium nitride film and tungsten film are consecutively deposited to obtain a layered metallic film. A heat treatment is then conducted at a temperature of about 700 degrees C. for around 10 minutes to react the titanium in the titanium film with the silicon substrate 11 to form titanium silicide film, which achieves an excellent contact resistance between the layered metallic film and the p-type diffused region 22.

Thereafter, the layered metallic film is subjected to patterning to form metallic plugs 29 in contact with the polysilicon plugs 24 within the memory cell area 10A and metallic plugs 30 in contact with the p-type heavily-doped diffused regions 22 within the peripheral circuit area 10B. Thereafter, a variety of known steps are performed such as forming capacitors connected to polysilicon plugs 24 within the memory cell area 10A, thereby completing a DRAM device 10.

In the conventional DRAM device as described above, the structure wherein the metallic plugs in contact with the diffused regions are used in the peripheral-circuit-area 10B is employed because metallic silicide achieving an excellent lower resistance is formed between the metallic plugs and the diffused regions by using the heat treatment. This structure is not used in the memory cell area 10A however, because there is a possibility that junction leakage current is increased because the metallic atoms such as titanium and cobalt are diffused within the silicon substrate to form recombination centers. That is, polysilicon plugs in contact with the diffused regions are used in the memory cell area 10A to suppress occurrence of the junction leakage current and thereby achieve a longer data retention time in the memory cell. The method for manufacturing a DRAM device wherein polysilicon plugs and metallic plugs are in contact with diffused regions is described in Patent Publication JP-A-2003-31684.

In order to improve the characteristics of the DRAM device, it is essential to suppress the junction leakage current of the cell transistor as well as to reduce the contact resistances between the contact plugs and the diffused regions. However, conventional methods for manufacturing a DRAM device have respective drawbacks and cannot achieve both a reduced junction leakage current and a lower contact resistance in the memory cell.

SUMMARY OF THE INVENTION

In view of the above problems in the conventional techniques, it is an object of the present invention to provide a method for manufacturing a semiconductor device which is capable of suppressing a junction leakage current in a transistor and reducing the contact resistance between the contact plug and the diffused region of the transistor.

The present invention provides, in a first aspect thereof, a method for manufacturing a semiconductor device consecutively including: forming on a silicon substrate a transistor having a diffused region connected to a polysilicon plug; treating the silicon substrate in a first heat treatment at a substrate temperature of 980 to 1,020 degrees C.; and treating the silicon substrate in a second heat treatment at a substrate temperature of 700 to 850 degrees C.

In accordance with the first aspect of the present invention, the second heat treatment increases the number of interstitial silicon atoms, which are once reduced by the first heat treatment, in the silicon substrate. The increased number of interstitial silicon atoms reduces the number of vacancy-type defects, thereby reducing junction leakage current in the transistor.

The present invention also provides, in a second aspect thereof, a method for manufacturing a semiconductor device consecutively including: forming first and second transistors in first and second areas, respectively, of a silicon substrate, the first transistor having a diffused region connected to a polysilicon plug, the second transistor having a diffused region connected to a metallic plug; treating the silicon substrate in a first heat treatment at a substrate temperature of 980 to 1,020 degrees C.; treating the silicon substrate in a second heat treatment at a substrate temperature of 700 to 850 degrees C.; implanting fluorine or fluorine compound into the diffused region of the second transistor; and treating the silicon substrate in a third heat treatment at a substrate temperature of 500 to 850 degrees C.

In accordance with the second aspect of the present invention, in addition to the advantage of the first aspect of the present invention, the fluorine or fluorine compound implanting step and the subsequent third heat treatment activate the dopant in the diffused region of the second transistor, which is once inactivated by the second heat treatment, in a higher probability. Thus, the contact barrier between the metallic plug and the diffused region of the second transistor can be reduced to reduce the contact resistance therebetween.

The present invention provides, in a third aspect thereof, a method for manufacturing a semiconductor device consecutively including: forming first and second transistors in first and second areas, respectively, of a silicon substrate, the first transistor having a diffused region connected to a polysilicon plug, the second transistor having a diffused region connected to a metallic plug; treating the silicon substrate in a first heat treatment at a substrate temperature of 980 to 1,020 degrees C.; treating the silicon substrate in a second heat treatment at a substrate temperature of 700 to 850 degrees C.; and spike-annealing the silicon substrate in a third heat treatment at a maximum temperature higher than the temperature of the first heat treatment.

In accordance with the third aspect of the present invention, in addition to the advantage of the first aspect of the present invention, the third heat treatment moves the inactive interstitial dopant atoms toward the lattice positions at which the dopant atoms easily replace the silicon atoms, whereby the contact resistance between the metallic plug and the diffused region of the second transistor can be reduced.

The above and other objects, features and advantages of the present invention will be more apparent from the following description, referring to the accompanying drawings.

PREFERRED EMBODIMENT OF THE INVENTION

Before describing preferred embodiments of the present invention, the principle of the present invention will be described for a better understanding of the present invention. The present inventors found the causes of the junction leakage current by analyses and experiments as detailed below.

Figure 2A:
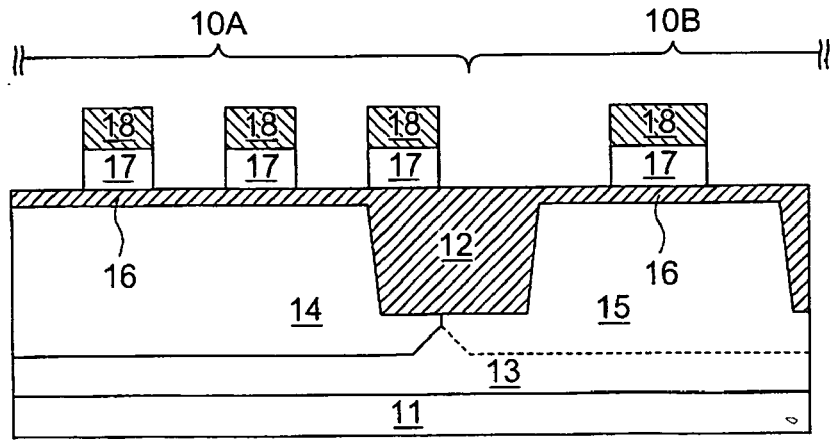
FIGS. 2A to 2F are sectional views of a semiconductor device during consecutive steps of a conventional process as well as the process shown in FIG. 1A.
Figure 2B:
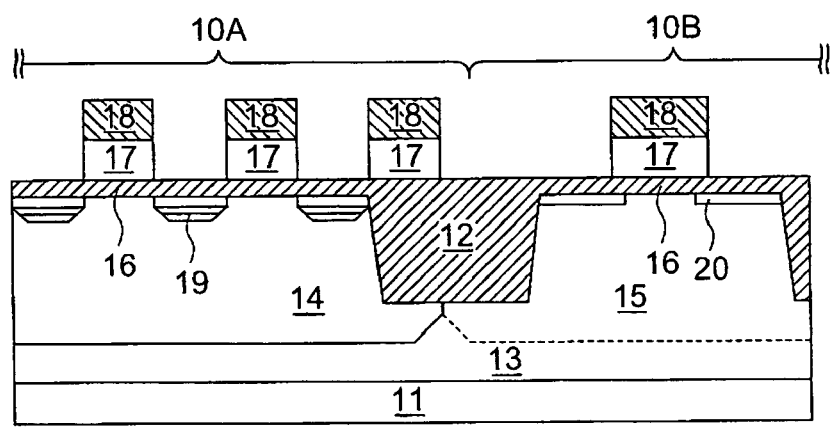

It is noted in the step shown in FIG. 2B that the phosphorous implantation into the memory cell area 10A expels silicon atoms from the lattices of the silicon crystal structure to generate vacancy-type defects and interstitial silicon atoms. The vacancy-type defect is such that a silicon atom is expelled from a lattice without substitute by another atom. Since the interstitial silicon atom has a higher diffusion rate compared to the vacancy-type defect, most interstitial silicon atoms are scattered during a heat treatment effected succeeding to the ion-implantation. This causes an excess of the number of vacancy-type defects in the vicinity of the n-type diffused region 19.

Figure 2C:
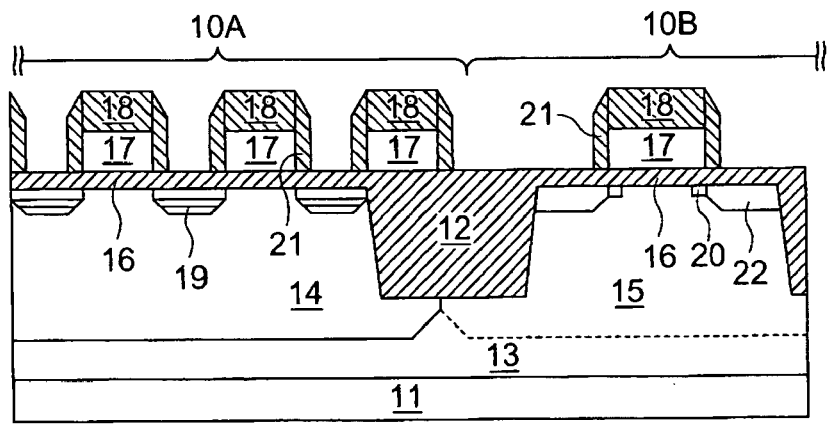
Figure 2D:
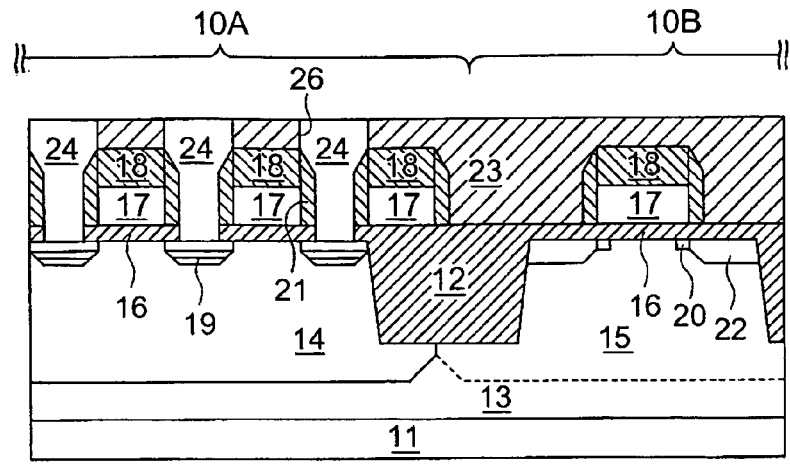
Figure 2E:
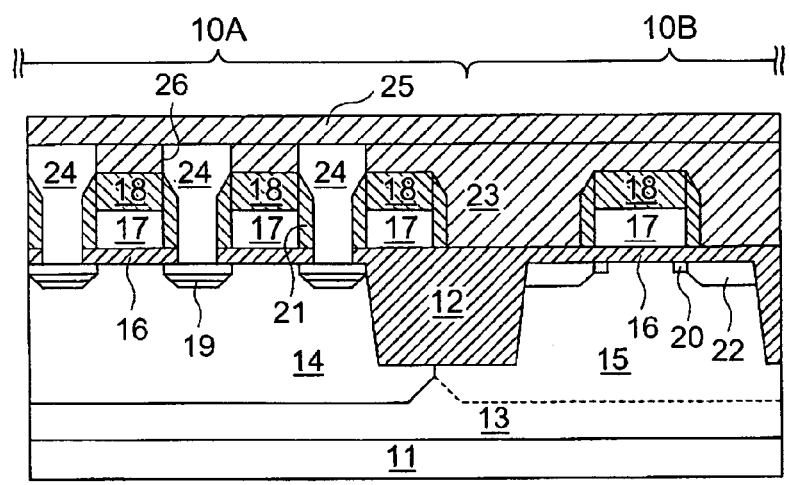

It is also noted in the step shown in FIG. 2E that the high-temperature heat treatment conducted after forming the polysilicon plugs 24 allow most of the interstitial silicon atoms to be absorbed in the polysilicon plugs 24. As a result, there further arises an excess of the number of the vacancy-type defects staying in the vicinity of the p-n junction, whereby the larger number of the vacancy-type defects increase the junction leakage current.

In view of the above, the junction leakage current should be reduced by reducing the number of the vacancy-type defects. For this purpose, the number of interstitial silicon atoms is increased in the silicon substrate by performing a first low-temperature heat treatment at a temperature of 700 to 850 degrees C. That is, the first low-temperature heat treatment, performed after the high-temperature heat treatment succeeding to formation of the polysilicon plugs 24, supplies interstitial silicon atoms to the n-type diffused region 19 having therein the vacancy-type defects, whereby the vacancy-type defects can be vanished in pair with the interstitial silicon atoms.

It is to be noted here that the first low-temperature heat treatment inactivates the boron implanted into the p-type lightly-doped diffused regions 20 and the p-type heavily-doped diffused regions 22 within the peripheral circuit area 10B. This is because the first low-temperature heat treatment generates a large number of interstitial silicon atoms, which expel the boron from the sites of substituted lattices, and the expelled boron cannot supply therefrom carriers any more.

The boron inactivated in the p-type heavily-doped diffused regions 22 raises the contact barrier between the metallic plug 30 and the p-type heavily-doped diffused region 22, thereby causing a new problem that the contact resistance between the metallic plug 30 and the p-type heavily-doped diffused region 22 increases.

The present inventors conceived to solve the new problem of the higher contact resistance between the metallic plug 30 and the p-type heavily-doped region 22 by implanting boron fluoride or fluorine into the p-type heavily-doped diffused regions 22 after the formation of the through-holes 28 and performing a second low-temperature heat treatment to activate the fluorine thus implanted.

The fluorine atoms, implanted as boron fluoride or fluorine into the p-type heavily-doped diffused regions 22, suppress generation of the interstitial silicon atoms to thereby prevent the boron atoms from being expelled from the sites of substituted lattices. This raises the ratio of activated boron atoms to the total boron atoms implanted into the n-type heavily-doped diffused regions 22. If boron fluoride is used in this implantation, the associated boron increases the boron concentration in the surface portions of the heavily-doped diffused regions 22 which is lowered once due to thermal diffusion effected by the first low-temperature heat treatment. The increased ratio of activated boron atoms in the p-type heavily-doped diffused regions 22 reduces the contact barriers between the metallic plugs 30 and the p-type heavily-doped diffused regions 22, thereby reducing the contact resistances between the metallic plugs 30 and the p-type heavily-doped diffused regions 22.

If the fluorine concentration is excessively high in the p-type heavily-doped diffused regions 22, formation of titan silicide having a lower resistance is prevented in the interface between the metallic plugs 30 and the p-type heavily-doped diffused regions 22. The excessively high fluorine concentration in the p-type heavily-doped diffused regions 22 should be reduced by diffusing the fluorine in the silicon substrate 11 by using the second low-temperature heat treatment.

Figure 1A:
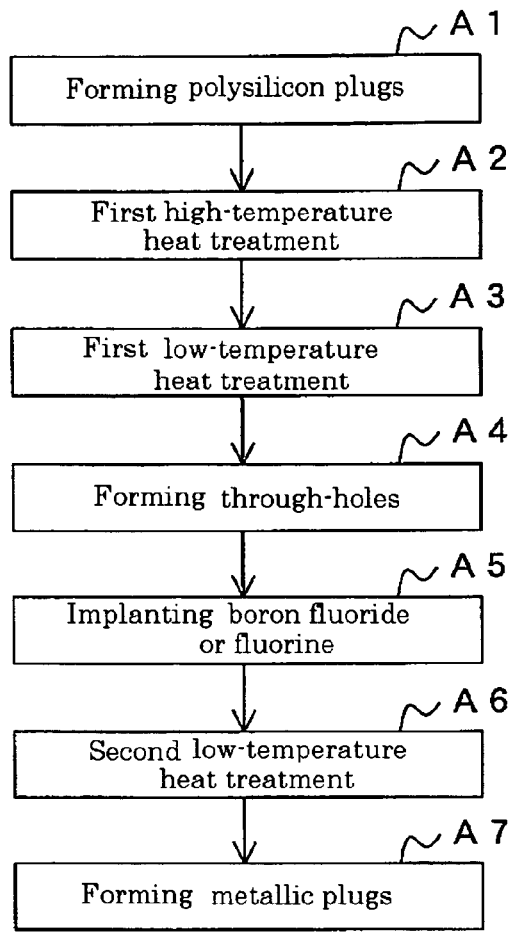
FIG. 1A is a flowchart of a process according to a first embodiment of the present invention.

FIG. 1 roughly shows a fabrication process for manufacturing a DRAM device according to a first embodiment of the present invention. The process includes: a variety of steps including formation of polysilicon plugs, such as shown in FIGS. 2A to 2D (step A1); first high-temperature heat treatment (step A2); first low-temperature heat treatment (step A3); formation of through-holes 28 such as shown in FIG. 2F (step A4); implantation of boron fluoride or fluorine into the p-type heavily-doped diffused regions exposed from the through-holes 28 (step A5); second low-temperature heat treatment (step A6); and formation of metallic plugs in the through-holes 28 (step A7).

A modification from the process shown in FIG. 1 may be such that a spike annealing process replaces the steps A5 and A6. The spike annealing process is conducted at a temperature higher than the temperature of the first high-temperature heat treatment for a relatively short time period, thereby moving inactive boron atoms staying between lattices toward the lattices at which the boron atoms replace silicon atoms. The spike annealing process raises the ratio of active boron atoms in the p-type heavily-doped diffused regions 22, to lower the contact barriers between the metallic plugs 30 and the p-type heavily-doped diffused regions 22 and reduce the contact resistances therebetween.

Figure 1B:
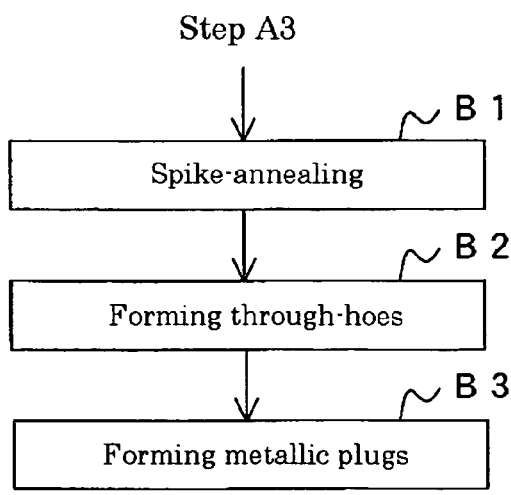
FIG. 1B is a partial flow chart of a process according to a second embodiment of the present invention.
Figure 2F:
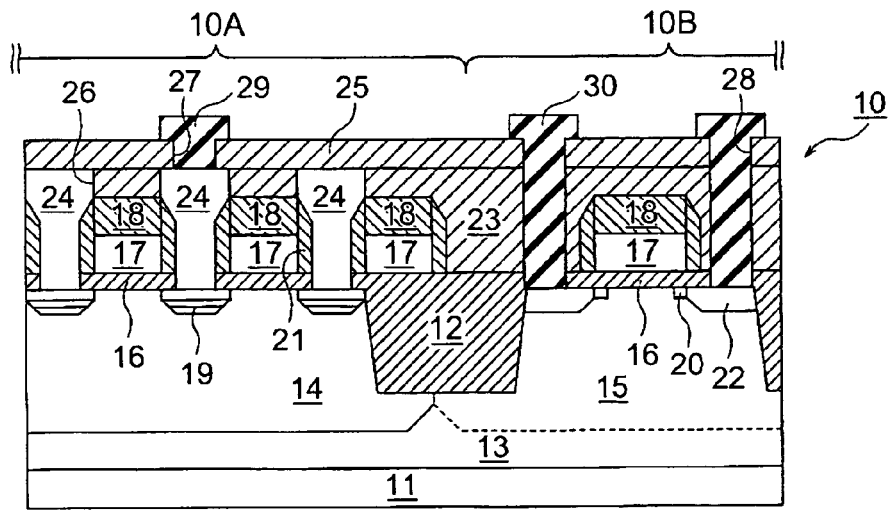

FIG. 1B shows a partial flowchart of a process according to a second embodiment, which is modified, as described above, from the process of FIG. 1A. The process of the second embodiment includes, succeeding to the steps A1 to A3 shown in FIG. 1A, the spike annealing process (step B1), formation of through-holes 28 (step B2), and formation of metallic plugs 30 in the through-holes 28 (step B3). In an alternative, the step B1 may be conducted after the step B2.

It was found in the present invention that the first high-temperature heat treatment should be performed at a temperature of 980 to 1,020 degrees C. A lower temperature below 980 degrees C. for the first high-temperature heat treatment reduces the threshold voltage of the cell transistor, whereas a higher temperature above 1,020 degrees C. for the first high-temperature heat treatment does not allow the subsequent first low-temperature heat treatment to increase the data retention time.

The first high-temperature heat treatment should preferably be conducted for 1 to 30 seconds. A shorter time length below 1 second makes it difficult to control the temperature, whereas a longer time length above 30 seconds excessively diffuses boron or phosphorous to reduce the threshold voltage of the cell transistor. The most preferable conditions of the first high-temperature heat treatment are around 1,000 degrees C. and around 10 seconds.

The first low-temperature heat treatment should preferably be conducted at a temperature of 700 to 850 degrees C. for 1 to 30 minutes. A more preferable temperature is around 800 degrees C., which generates a particularly larger number of interstitial silicon atoms. At such a temperature, the first low-temperature heat treatment should be preferably conducted for 1 to 10 minutes.

The time length of 1-minute or above allows the first low-temperature heat treatment to supply a sufficient number of interstitial silicon atoms to the vicinity of the vacancy type defects. The maximum time length, 30 minutes, is determined by an allowable level of the reduced threshold voltage in the cell transistor, because the inactivation of boron atoms introduced in the p-type heavily-doped diffused regions reduces the threshold voltage.

The temperature of 700 degrees C. or above in the first low-temperature heat treatment improves the data retention time in the memory cells. A temperature above 850 degrees C. in the first low-temperature heat treatment excessively diffuses boron introduced in the p-type channel layer for the cell transistors, and thereby reduces the threshold voltage of the cell transistors.

It is preferable that implantation of boron fluoride be conducted at an acceleration energy of 1 to 50 keV and a dosage of 1 to $5 \times 10^{15}/cm^2$. Implantation of boron fluoride or fluorine in addition to boron provides a higher ratio of activated boron after the succeeding second low-temperature heat treatment compared to the case in which boron is implanted alone. For example, only around 5% of boron is activated in the latter case in which boron is implanted alone, whereas around 50% of boron is activated in the former case in which boron fluoride is implanted in addition to boron.

If the acceleration energy of boron fluoride is below 1 keV, then the implanted boron fluoride stays at a shallower location of the silicon substrate. In this case, fluorine is absorbed by titanium silicide upon formation of titanium silicide, whereby titanium silicide having an excellent low resistance cannot be formed. On the other hand, if the acceleration energy is above 50 keV, then boron is implanted into a position underlying the gate electrode apart from the contact surface between the metallic plug 30 and the p-type heavily-doped diffused region 22, thereby reducing the threshold voltage of transistors in the peripheral circuit.

A lower dosage of boron fluoride below $1\times10^{15}/cm^2$ is not preferable because the low boron concentration in the p-type heavily-doped diffused regions 22 cannot provide a sufficiently lower contact resistance. A higher dosage of boron fluoride is also not preferable because the boron is introduced into the channel regions underlying the gate electrodes in the peripheral circuit area to reduce the threshold voltage of the transistors in the peripheral circuit.

The boron fluoride to be implanted may be boron difluoride for achieving a higher ion current or injection current to reduce the time length for the ion-implantation. In this case, the acceleration energy and dosage should preferably be 25 keV and $3\times10^{15}/cm^2$, respectively.

The second low-temperature heat treatment should preferably be conducted at a temperature of 500 to 850 degrees C. A temperature equal to or above 500 degrees C. provides a higher ratio of activated boron, whereas a higher temperature above 850 degrees C. excessively diffuses boron in the p-type channel layer for the cell transistor to reduce the threshold voltage thereof. The second low-temperature heat treatment should preferably be conducted at a temperature around 700 degrees C. for about 10 minutes.

The spike annealing process should preferably conducted at a temperature of 1,000 to 1,050 degrees C. A lower temperature below 1,000 degrees C. for the spike annealing does not sufficiently reduce the contact resistances between the metallic plugs 30 and the p-type heavily-doped diffused regions 22. A higher temperature above 1,050 degrees C. excessively diffuses boron in the p-type channel layer for the cell transistors to reduce the threshold voltage thereof. The maximum temperature of the spike annealing process is preferably 1,030 degrees C. so long as the first high-temperature heat treatment and the first low-temperature heat treatment are conducted under the conditions as described above.

The spike annealing process should preferably use a temperature profile including a temperature rise rate of 100 degrees C. per second or above, a time length of 1 second or less for which the maximum temperature is maintained, and a temperature fall rate of 50 degrees C. per second or above. Such a temperature profile suppresses degradation of the short channel characteristic of the peripheral circuit transistors. In addition, this temperature profile suppresses fluctuation of the threshold voltage due to leakage of boron in the case of gate electrodes made of boron-containing polysilicon.

Each of the first high-temperature heat treatment, first and second low-temperature heat treatments and the spike annealing process may be conducted at an atmosphere of nitrogen gas, argon gas, or a mixture of such gas and a minute amount of oxygen.

Now, the present invention is more specifically described with reference to preferred embodiments thereof. A process according to a first embodiment of the present invention is similar to the conventional process described with reference to FIGS. 2A to 2F except for those steps as detailed below. The process of the present embodiment is preferably used to manufacture of a DRAM device including a memory cell area and a peripheral circuit area.

The process of the present embodiment includes a step such as shown in FIG. 2B, wherein the phosphorous implantation is conducted at an acceleration energy of 20 keV and a dosage of $1.5\times10^{13}/cm^2$, the boron implantation is conducted at an acceleration energy of 5 keV and a dosage of $1\times10^{14}/cm^2$, and the implanted phosphorous and boron are activated by a heat treatment at a temperature of 950 degrees C. for 30 seconds.

The process of the present embodiment includes a step such as shown in FIG. 2C, wherein the side spacers 21 have a thickness of 40 nm, the phosphorous implantation is conducted at an acceleration energy of 10 keV and a dosage of $1\times10^{15}/cm^2$, and the implanted boron is heat treated for activation at a temperature of 950 degrees C. for 30 seconds.

The process of the present embodiment includes a step such as shown in FIG. 2D, wherein the thickness of the first interlevel dielectric film 23 is 400 nm, the phosphorous implantation for forming the electric-field-alleviating layer is conducted at an acceleration energy of 50 keV and a dosage of $1\times10^{13}/cm^2$, and the polysilicon plugs 24 in the through-holes 26 is doped with phosphorous at a concentration of $2\times10^{20}/cm^3$.

The process of the present embodiment includes a step such as shown in FIG. 2E, wherein the thickness of the second interlevel dielectric film 25 is 100 nm, and the first low-temperature heat treatment is continued from the first high-temperature heat treatment without an intervening step or without lowering the ambient temperature to a specific lower temperature. The first low-temperature heat treatment is conducted in a $N_2$ environment at a temperature of 800 degrees C. for 10 minutes.

The process of the present embodiment includes a step such as shown in FIG. 2F, wherein formation of through-holes 28 is followed by implantation of boron difluoride at an acceleration energy of 25 keV and a dosage of $3\times10^{15}/cm^2$ into portions of the p-type heavily-doped diffused regions 22 exposed from the through-holes 28 in the peripheral circuit area 10B. The succeeding second low-temperature heat treatment is conducted in a $N_2$ environment at a temperature of 700 degrees C. for 60 seconds. The second low-temperature heat treatment activates the boron implanted into the p-type heavily-doped diffused regions 22 and diffuses the fluorine implanted into the p-type heavily-doped diffused regions 22. The formation of layered metallic film includes consecutive deposition of a 10-nm-thic titanium film, 20-nm-thick titanium nitride film and a 50-nm-thick tungsten film.

In accordance with the process of the present embodiment, the first low-temperature heat treatment generates interstitial silicon atoms in the silicon substrate 11. Thus, silicon concentration once reduced after the first high-temperature heat treatment is increased and the generated interstitial silicon atoms are supplied to the n-type heavily-doped diffused regions 19 to thereby reduce the number of vacancy-type defects therein. This reduces the junction leakage current of the cell transistors caused by the vacancy-type defects, to improve the data retention time. In addition, the first low-temperature heat treatment continued from the first high-temperature heat treatment reduces the time length of the process.

The implantation of boron difluoride into the p-type heavily-doped diffused regions 22 and the associated second low-temperature heat treatment, which are conducted after the first low-temperature heat treatment, activate, in a higher probability, boron in the p-type heavily-doped diffused regions 22 once inactivated by the first low-temperature heat treatment. This activation reduces the contact barriers between the metallic plugs 26 and the p-type heavily-doped diffused regions 22 to thereby reduce the contact resistances therebetween.

The process of the present embodiment was used to manufacture first examples of the semiconductor device for assuring the advantage of the present invention. For comparison, a conventional process was used to manufacture first comparative examples, and another process similar to the above embodiment except for omission of the implantation of boron difluoride and the second low-temperature heat treatment was used to manufacture second comparative examples.

Comparison between the first examples and the first comparative examples as to the data retention characteristic revealed that the first examples exhibited a 20%-improvement of the data retention time over the first comparative examples. The contact resistances between the metallic plugs 30 and the p-type heavily-doped diffused regions 22 were measured in the first examples and first and second comparative examples, and the thus measured contact resistances were around 700, 800 and 1200 ohms, respectively. Comparison of the first examples and the second comparative examples revealed that the implantation of born difluoride and associated second low-temperature heat treatment effectively reduced the contact resistances between the metallic plugs 30 and the p-type heavily-doped diffused regions 22.

The first examples and first comparative examples were subjected to a CMP (chemical-mechanical polishing) process to expose the polysilicon plugs 24 in these samples. The exposed polysilicon plugs 24 in number of 51 were connected in common to an interconnection, which is obtained by consecutively depositing titanium, titanium nitride and tungsten to form a layered metallic film and subsequent patterning thereof. The 51 polysilicon plugs were treated as a single test element group (TEG), and about 800 TEGs were subjected to measurements of junction leakage current.

Figure 3:
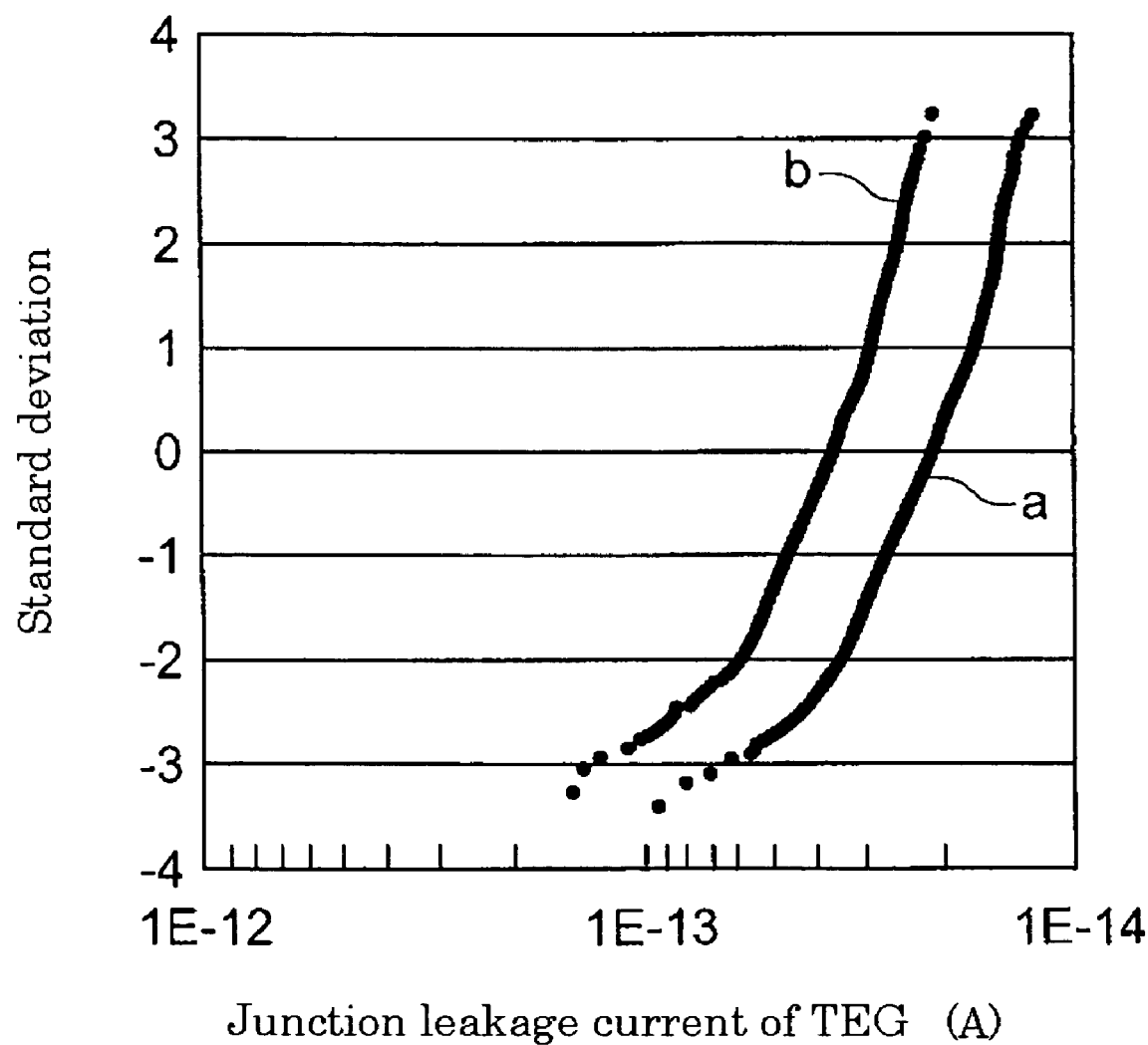
FIG. 3 is a graph showing a cumulative distribution graph of junction leakage currents measured in test element groups (TEGs), wherein the standard deviation of the measured junction leakage currents is plotted on ordinate.

The results of the measurements for the junction leakage current are shown in FIG. 3 in cumulative distribution graphs, wherein the total junction leakage current of a TEG is plotted on abscissa and the standard deviation thereof is plotted on the ordinate. In FIG. 3, graph (a) shows the measured results of TEGs of the first examples whereas graph (b) shows the measured results of TEGs of the first comparative examples. As understood from FIG. 3, the first examples have reduced junction leakage currents compared to the first comparative examples.

In the cumulative distribution graphs of FIG. 3, some TEGs each exhibiting a higher junction leakage current and plotted on the tail side of each graph are then subjected to an electrically detected magnetic resonance (EDMR) test as to the density of the vacancy-type defects.

The EDMR test is such that the semiconductor device under test is located in a magnetic field and irradiated with a microwave to measure the junction leakage current of the semiconductor device. The magnetic field is changed in the magnetic flux thereof during the test. When a specific magnetic field having a magnetic flux corresponding to the inherent energy of the vacancy-type defects staying in the depletion layer is applied, an increase of the junction leakage current is observed. By identifying the magnetic field upon observation of the increase in the junction leakage current, the types of the defects can be determined. In addition, the number of defects can be estimated based on the amount of increase in the junction leakage current.

It is to be noted that the increase in the junction leakage current is caused by a defect staying in the depletion layer of the p-n junction. Accordingly, by changing the voltage applied to the gate electrode to change the location of the depletion layer, defects located at a variety of positions in the vicinity of the gate electrode can be detected and measured for the junction leakage current. The EDMR test is described in a literature entitled "Defects related to DRAM leakage current studied by electrically detected magnetic resonance" and presented by T. Umeda et al. on "Physical B 308-310", pp 1169-1172 (2001).

Figure 4A:
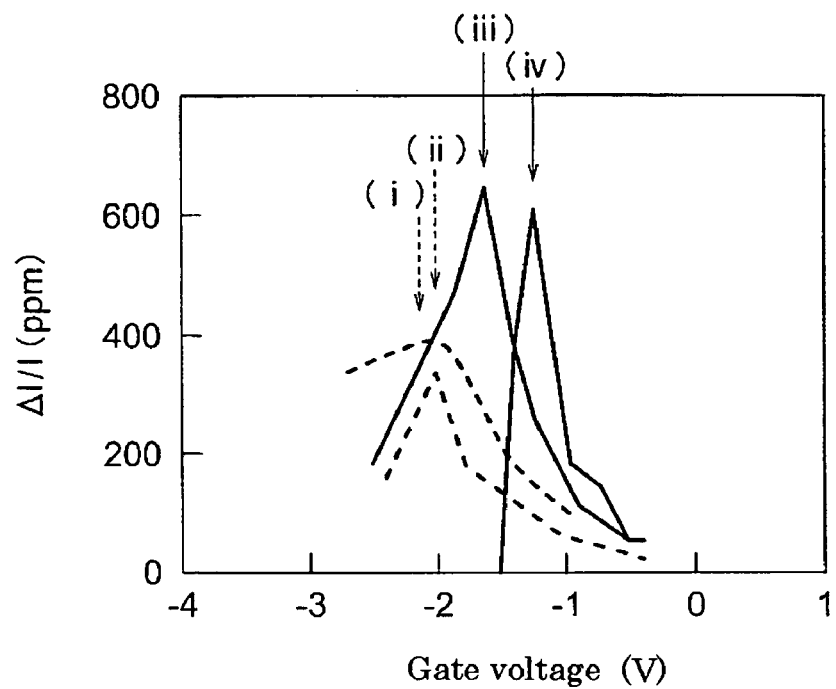
FIG. 4A is a graph showing the relationships between the EDMR signal intensities and the gate voltages, measured for the TEGs shown at the tail of the graph of FIG. 3.

FIG. 4A shows the results of the EDMR test, wherein the gate voltage is plotted on abscissa and the signal intensity $\Delta I/I$ of the EDMR test is plotted on ordinate. In FIG. 4A, graphs represented by two dotted lines show the results of TEGs of the first examples whereas graphs represented by two solid lines show the results of TEGs of the first comparative examples. The arrows denoted by symbols (i), (ii), (iii) and (iv) represent the peak positions in the respective graphs.

Figure 4B:
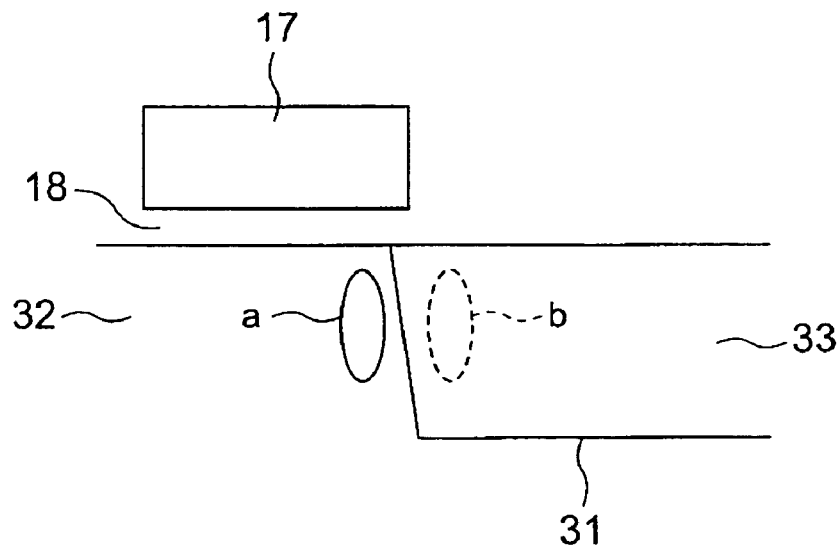
FIG. 4B is a schematic sectional view of a cell transistor for showing the location of a vacancy-type defect which causes the junction leakage current.

FIG. 4B shows a schematic sectional view of a semiconductor device having a transistor including a gate electrode 17, a gate oxide film 18, an n-type source/drain diffused region 33 and a p-type channel layer 32 underlying the gate electrode 17. The semiconductor device shown in FIG. 4B has a metallurgical p-n junction 31 formed by the p-type channel layer 32 and the n-type source/drain diffused region 33. Symbols "a" and "b" represent the types of vacancy-type defects located in the vicinity of the metallurgical p-n junction 31, wherein a type-a defect is located in the p-type channel layer 32 and a type-b defect is located in the n-type source/drain diffused region 33.

As understood from the peak positions of the EDMR signal and the signal intensity shown by the solid lines in FIG. 4A, semiconductor devices of the first comparative examples had mainly type-a vacancy-type defects in the side of the p-type channel layer 32 in the vicinity of the metallurgical p-n junction 31. On the other hand, semiconductor device of the first examples had mainly type-b vacancy-type defects mainly in the side of the n-type source/drain region 33 in the vicinity of the metallurgical p-n junction 31. In addition, the number of vacancy-type defects is smaller in the first example than in the first comparative examples. From these results, it was found that the method of the present embodiment reduced the number of vacancy-type defects in the vicinity of the metallurgical junction 31, which is applied with a high electric field.

The first examples and first comparative examples were also subjected to a convergent-beam electron diffraction (CBED) test for measuring the amount of lattice strain in a portion of the silicon substrate 11 underlying the polysilicon plug 24. The CBED test is such that the sample under test is irradiated with an electron beam converged at the position to be measured, and deviation of the lattice constant is measured based on the image diffracted by the silicon crystal to calculate the amount of lattice strain at the irradiated position. The measurement using the CBED technique is described in a literature entitled "Local lattice strain measurements in semiconductor devices by using convergent-beam electron diffraction" and presented by A. Toda et al. on "J. Crystal Growth 210" (2000), pp 341-345.

Figure 5A:
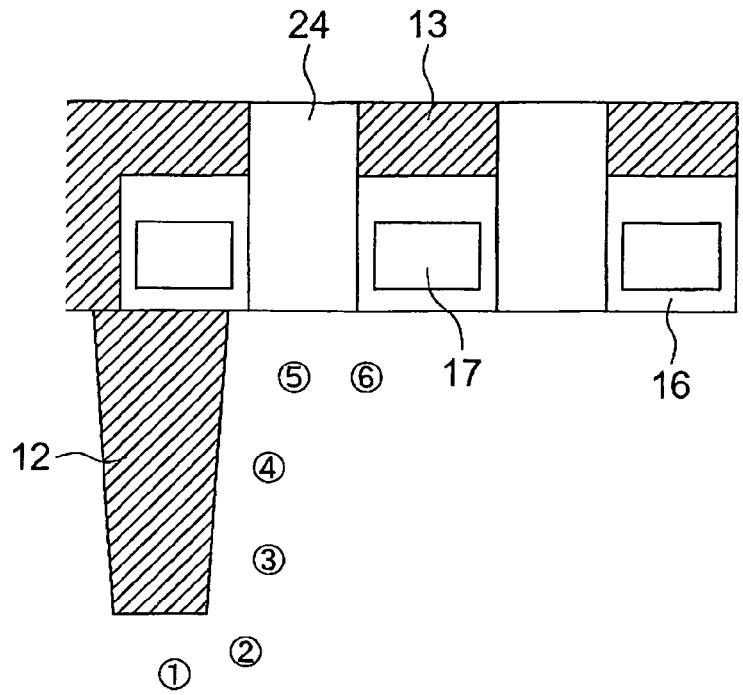
FIG. 5A is a schematic sectional view of the vicinity of polysilicon plugs and positions of measurements using the CBED technique.
Figure 5B:
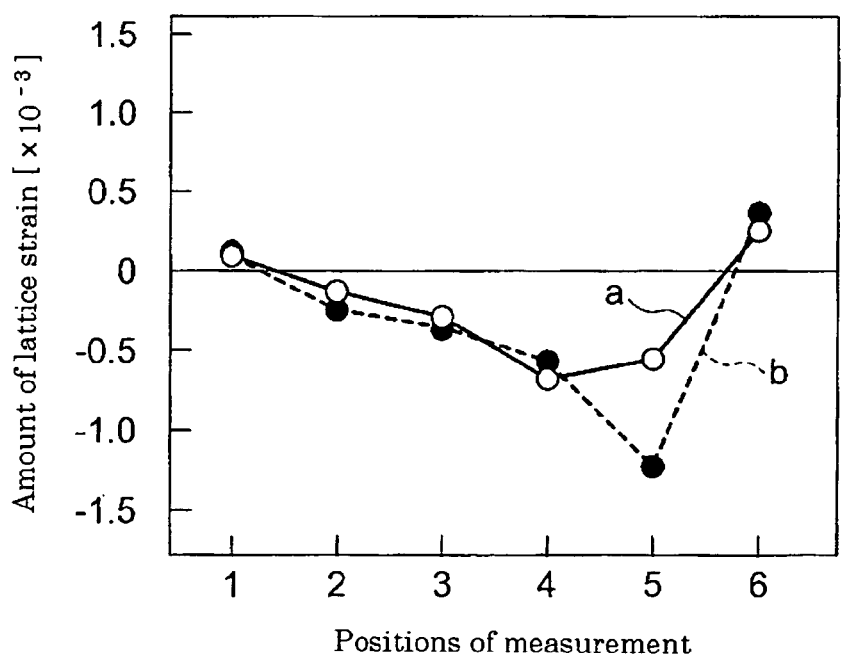
FIG. 5B is a graph showing the amount of lattice strains of the respective positions shown in FIG. 5A.

FIG. 5A shows the positions "1" to "6" of measurements in the vicinity of polysilicon plugs 24 by using the CBED technique. FIG. 5B shows the results of the measurements, wherein positions of measurements are plotted on abscissa and the amount of lattice strain is plotted on ordinate with the tensile strain and compressive stain being positive and negative, respectively. Graph "a" represents the results of measurements for the first example, whereas graph "b" represents the results of measurements for the first comparative example. The lattice strain was measured in the direction parallel to the substrate surface.

As understood from FIG. 5B, the compressive strain at the position 5 right under the polysilicon plug 24 is maximum in the absolute value of the lattice strain in the first comparative example although the compressive strain at position 5 is relatively low in the first example. This is considered due to the fact that the polysilicon plug 24 has a large internal stress in the first comparative example to pull the silicon substrate 11 in the vertical direction, and as a result, a compressive strain having a value of Poisson's ratio is applied to the silicon substrate 11 in the direction parallel to the substrate surface. On the other hand, in the semiconductor device of the first example, part of the large number of interstitial silicon atoms generated by the first low-temperature heat treatment is absorbed by the polysilicon plug 24. Thus, the internal stress of the polysilicon plug 24 is changed, whereby the tensile stress pulling the silicon substrate 11 in the vertical direction is reduced and the compressive strain in the direction parallel to the substrate surface is lower.

By alleviating the stress caused by the polysilicon plug 24, the strain in the portion of the silicon substrate 11 underlying the polysilicon plug 24 is reduced, whereby the mechanical or thermal stress in the product semiconductor device can be reduced, the mechanical or thermal stress being generated during fabricating the semiconductor device in a package. Thus, fluctuation of the data retention characteristic in the semiconductor device can be reduced.

Figure 6:
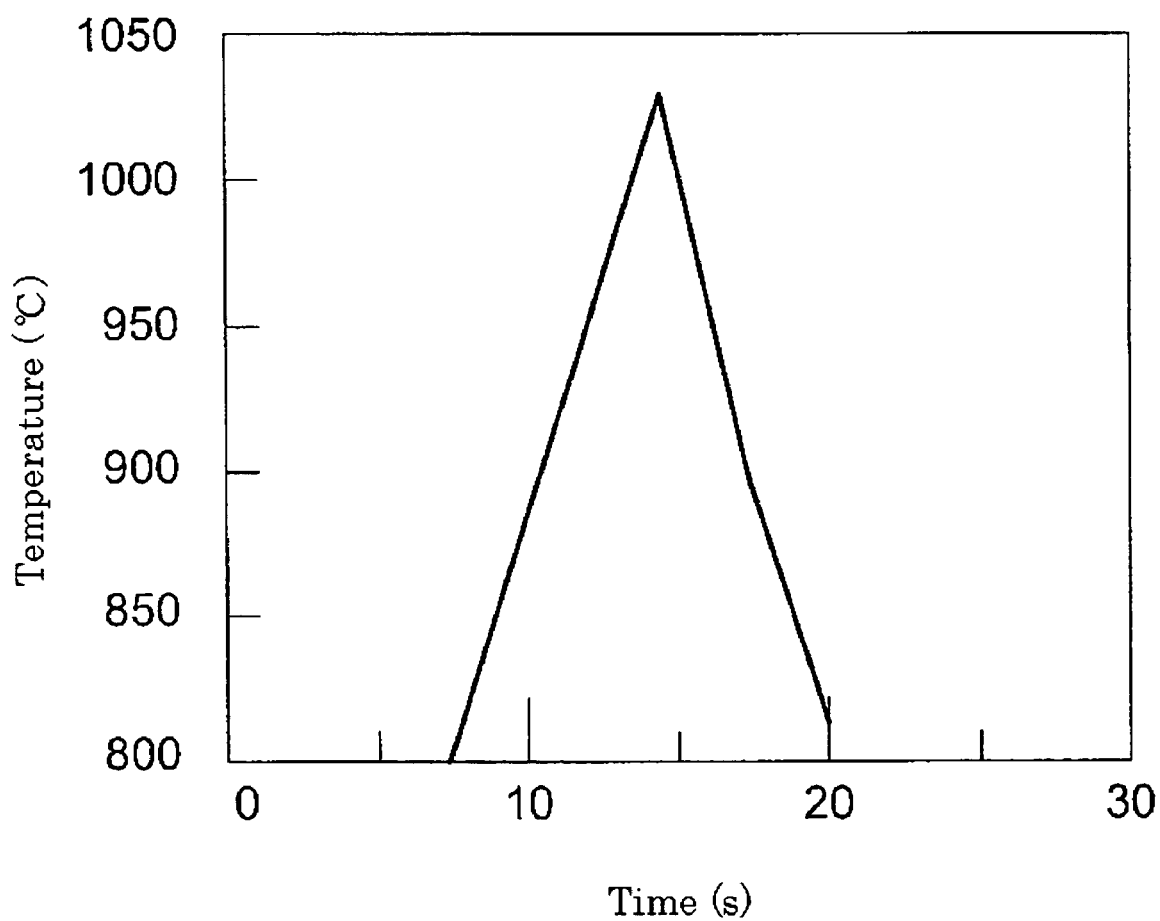
FIG. 6 is a graph showing a temperature profile of the spike annealing in a process according to a second embodiment of the present invention.

A method for manufacturing a semiconductor device according to a second embodiment of the present invention will be described hereinafter. In the second embodiment, the first low-temperature heat treatment is conducted at a temperature of 820 degrees C. for 10 minutes. The first low-temperature heat treatment is followed by a spike annealing process performed in a $N_2$ environment according to a temperature profile such as shown in FIG. 6. The temperature profile specifies a peak substrate temperature of 1,030 degrees C., a rise period during which the substrate temperature is raised at a rate of 100 degrees C. per second or above from the temperature of the first low-temperature heat treatment to the peak substrate temperature, and a fall period during which the substrate temperature is lowered at a rate of 50 degrees C. per second or above from the peak substrate temperature. The process of the present embodiment uses implantation of boron difluoride and does not include the second low-temperature heat treatment. The other configuration of the process of the present embodiment is similar to that of the process of the first embodiment.

The spike annealing process conducted in the present embodiment at a higher temperature than the first high-temperature heat treatment allows inactive interstitial boron atoms toward the lattices at which the boron atoms replace the silicon atoms. Thus, boron atoms once inactivated in the p-type heavily-doped diffused regions 22 by the first low-temperature heat treatment are activated by the spike annealing process, whereby the contact resistances between the metallic plugs 30 and the p-type heavily-doped diffused regions 22 can be reduced.

Semiconductor devices were manufactured by the process of the second embodiment to obtain second examples of the present invention. The second examples were subjected to measurements of the data retention characteristic. The measured data retention times were 30% longer than the data retention times of the first comparative examples. The contact resistances of the second examples measured between the metallic plugs 30 and the p-type heavily-doped regions 22 were around 600 ohms. Comparison of the second examples and second comparative examples revealed that the spike annealing process effectively reduced the contact resistances between the metallic plugs and the p-type heavily-doped diffused regions. It is also noted that the second examples had contact resistances lower than the contact resistances of the first comparative examples.

Since the above embodiments are described only for examples, the present invention is not limited to the above embodiments and various modifications or alterations can be easily made therefrom by those skilled in the art without departing from the scope of the present invention.

What is claimed is:

1. A method of manufacturing a semiconductor device comprising:
    forming a first transistor on a silicon substrate, said first transistor comprising a first diffused region connected to a polysilicon plug;
    forming a second transistor on said silicon substrate, said second transistor comprising a second diffused region;
    forming an insulating layer on said first and second transistors;
    treating said silicon substrate in a first heat treatment such that a resistance of said polysilicon plug is reduced;
    treating said silicon substrate in a second heat treatment that supplies interstitial silicon atoms to said first diffused region such that a vacancy-type defect of said first diffused region is removed; and
    after said second heat treatment, forming a conductive plug coupled to said second diffused region.

2. The method according to claim 1, wherein said first heat treatment comprises heating said silicon substrate at a substrate temperature in a range from 980 degrees C. to 1,020 degrees C., and
    wherein said second heat treatment comprises heating said silicon substrate at a substrate temperature in a range from 700 degrees C. to 850 degrees C.

3. The method according to claim 1, wherein a duration of said second heat treatment comprises a range from 1 minute to 30 minutes.

4. The method according to claim 1, wherein a duration of said first heat treatment comprises a range from 1 second to 30 seconds.

5. The method according to claim 1, wherein the forming the conductive plug coupled to said second diffused region comprises forming a through-hole in said insulating layer and implanting one of fluorine and a fluorine compound into said second diffused region through said through-hole.

6. The method according to claim 1, further comprising:
    before said first and second heat treatments, introducing phosphorous into said first transistor to form said first diffused region and boron into said second transistor to form said second diffused region.

7. The method according to claim 1, wherein said second heat treatment continues from said first heat treatment.

8. The method according to claim 5, further comprising:
    after said implanting, treating said silicon substrate in a third heat treatment to diffuse said one of fluorine and said fluorine compound.

9. The method according to claim 5, wherein said implanting comprises introducing boron into said second diffused region, and
    wherein said implanting said one of fluorine and said fluorine compound implants boron fluoride at an acceleration energy in a range from 1 keV to 50 keV and a dosage in a range from $1 \times 10^{15}/cm^2$ to $5 \times 10^{15}/cm^2$.

10. The method according to claim 8, wherein said third heat treatment comprises heating said silicon substrate at a substrate temperature in a range from 500 degrees C. to 850 degrees C.

11. The method according to claim 8, wherein said third heat treatment comprises spike-annealing said silicon substrate at a maximum substrate temperature greater than a substrate temperature of said first heat treatment.

12. The method according to claim 11, wherein said maximum substrate temperature of said spike-annealing said silicon substrate is in a range from 1,000 degrees C. to 1,050 degrees C.

13. The method according to claim 11, wherein said first heat treatment comprises heating said silicon substrate at a substrate temperature in a range from 980 degrees C. to 1,020 degrees C., and
wherein said second heat treatment comprises heating said silicon substrate at a substrate temperature in a range from 700 degrees C. to 850 degrees C.

14. The method according to claim 11, wherein a duration of said second heat treatment comprises a range from 1 minute to 30 minutes.

15. The method according to claim 11, wherein said second heat treatment continues from said first heat treatment.

16. A method of manufacturing a semiconductor device, comprising:
forming a first transistor on a silicon substrate, the first transistor comprising a first diffused region;
forming a second transistor on the silicon substrate, the second transistor having a second diffused region;
covering the silicon substrate, the first transistor, and the second transistor with an insulating layer;
forming a silicon plug in the insulating layer coupled to the first diffused region;
treating the silicon substrate in a first heat treatment in which the silicon substrate is heated at a temperature in a range from 980 degrees C. to 1,020 degrees C.;
treating the silicon substrate in a second heat treatment in which the silicon substrate is heated at a temperature in a range from 700 degrees C. to 850 degrees C., the second heat treatment having a duration in a range from 1 minute to 30 minutes;
after the second heat treatment, forming a contact hole penetrating the insulating layer to expose the second diffused region; and
filling the contact hole with metal.

17. The method according to claim 16, further comprising:
treating the silicon substrate in a third heat treatment between the forming the contact hole and the filling the contact hole,
wherein, in the third heat treatment, the silicon substrate is heated at a temperature in a range of 500 degrees C. to 850 degrees C.

18. The method according to claim 16, further comprising:
implanting one of fluorine and a fluorine compound into the second diffused region between the forming the contact hole and the filling the contact hole.

19. The method according to claim 18, wherein the implanting comprises implanting a boron fluoride.

20. The method according to claim 16, wherein the duration of the second heat treatment is in a range from 1 minute to 10 minutes.

* * * * *